US008829486B2

(12) United States Patent
Lee et al.

(10) Patent No.: US 8,829,486 B2
(45) Date of Patent: Sep. 9, 2014

(54) LIGHT-EMITTING DEVICE HAVING ACTIVE LAYERS STACKED ALTERNATELY

(75) Inventors: Rong-Ren Lee, Hsinchu (TW); Shih-Chang Lee, Hsinchu (TW); Chien-Fu Huang, Hsinchu (TW); Tsen-Kuei Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/313,645

(22) Filed: Dec. 7, 2011

(65) Prior Publication Data

US 2012/0138892 A1 Jun. 7, 2012

(30) Foreign Application Priority Data

Dec. 7, 2010 (TW) ............................ 099142743 A

(51) Int. Cl.
*H01L 29/06* (2006.01)
*H01L 33/08* (2010.01)
*H01L 27/15* (2006.01)
*H01L 33/32* (2010.01)

(52) U.S. Cl.
CPC ................ *H01L 27/15* (2013.01); *H01L 33/32* (2013.01); *H01L 33/08* (2013.01)
USPC .................................... 257/13; 257/E33.008

(58) Field of Classification Search
USPC ............ 257/79–103, 189, 200, 615, E33.023, 257/13–14
See application file for complete search history.

(56) References Cited

U.S. PATENT DOCUMENTS

2004/0026683 A1* 2/2004 Yamada et al. ................ 257/10
2007/0075306 A1* 4/2007 Hayashi et al. ................ 257/13
2009/0206322 A1* 8/2009 Brandes ......................... 257/13
2009/0272963 A1* 11/2009 Sakamoto et al. ............. 257/13
2011/0104843 A1* 5/2011 Jun ............................... 438/45

FOREIGN PATENT DOCUMENTS

TW 200623462 7/2006

* cited by examiner

*Primary Examiner* — Lex Malsawma
*Assistant Examiner* — Laura Dykes
(74) *Attorney, Agent, or Firm* — Muncy, Geissler, Olds & Lowe, P.C.

(57) ABSTRACT

A light-emitting device comprises a substrate, and a light-emitting structure formed on the substrate. The light-emitting structure comprises a first active layer emitting the light with a first wavelength, and a second active layer emitting the light with a second wavelength. The light-emitting structure is formed by the first active layer and the second active layer stacked alternately.

12 Claims, 4 Drawing Sheets

1

100

12

13

11

100a

100b

LIGHT-EMITTING DEVICE HAVING ACTIVE LAYERS STACKED ALTERNATELY

RELATED APPLICATIONS

The present application claims the right of priority based on Taiwan Patent Application No. 099142743 entitled "LIGHT-EMITTING DEVICE", filed on Dec. 7, 2010, and is incorporated herein by reference in its entirety and assigned to the assignee herein.

TECHNICAL FIELD

The present application relates to a light-emitting device, and more particularly, to a light-emitting device having a first active layer and a second active layer stacked alternately.

BACKGROUND

Recently the light-emitting diode (LED) becomes one of the solid state lighting sources having an extremely potential due to the epitaxy and process technology progress. LED can only be driven by direct current due to physical mechanism restriction, therefore the alternating current provided directly from the power plant is transferred to the direct-current used by LED in any lighting design for LED light source. The above electronic devices for rectification and voltage adjustment increase the cost and decrease the efficiency of the alternating current transfer to direct current, not mention to its big volume. The above disadvantages can influence the reliability and life-time of the LED used in illumination application in daily life.

ACLED devices do not need the electronics devices for rectification and/or voltage adjustment and can be directly operated under alternating current, so the ACLED devices are highly possible to be the mainstream products of the solid state lighting source in stationary position in the future.

Because of the current leakage, the luminous intensity of LED drops when the temperature is increased. To alleviate the current leakage problems, the carrier concentration of the p-type confining layer is usually increased, or a material with higher level energy gap material is grown to increase the confining ability of the electrons. In most situations, the increasing degree of the carrier concentration of the p-type confining layer is limited, and when the carrier concentration of the p-type confining layer is increased, the light emitting quality is affected because the higher carrier concentration forces the p-type carrier move towards the active layer which has lower carrier concentration.

SUMMARY

A light-emitting device, comprising a substrate; and a light-emitting structure on the substrate, comprising a first active layer and a second active layer stacked alternately, wherein the light-emitting device has a first temperature coefficient when the light-emitting structure is formed by a first manufacturing process, and has a second temperature coefficient when the light-emitting structure is formed by a second manufacturing process, wherein the absolute value of the difference between the first temperature coefficient and the second temperature coefficient is smaller than 0.12%/K.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein.

DETAILED DESCRIPTION OF THE PREFERRED EMBODIMENTS

The present application provides a method to grow two active layers having different wavelengths in the light-emitting structure to solve the luminous intensity of a light-emitting device decreased as the temperature increased. In light of the energy state theory, the probability of an electron occupied the lower energy level (i.e. the longer wavelength) of the active layer is higher. When the energy of an electron is increased as the temperature is increased, the probability of an electron jumping from the lower energy level to the higher energy level is increased, so a higher energy level (i.e. the shorter wavelength) of the active layer is provided for electrons to jump.

The temperature coefficient (TC) is usually referred to indicate the decreased degree of the luminous intensity of the light-emitting device as the temperature increases. The definition is described below: if the flux of a light-emitting device is $f_1$ lm at $T_1$ temperature, the flux is $f_2$ lm at $T_2$ temperature, and if the flux of the $T_1$ temperature is normalized to 1, the flux of the $T_2$ temperature is normalized to $(f_2/f_1)$, the temperature coefficient (TC) of the light-emitting device can be indicated by the below equation, and the value is smaller than 0:

$$TC=((f_2/f_1)-1)/(T_2-T_1) \quad \text{equation (1)}$$

Figure 1:
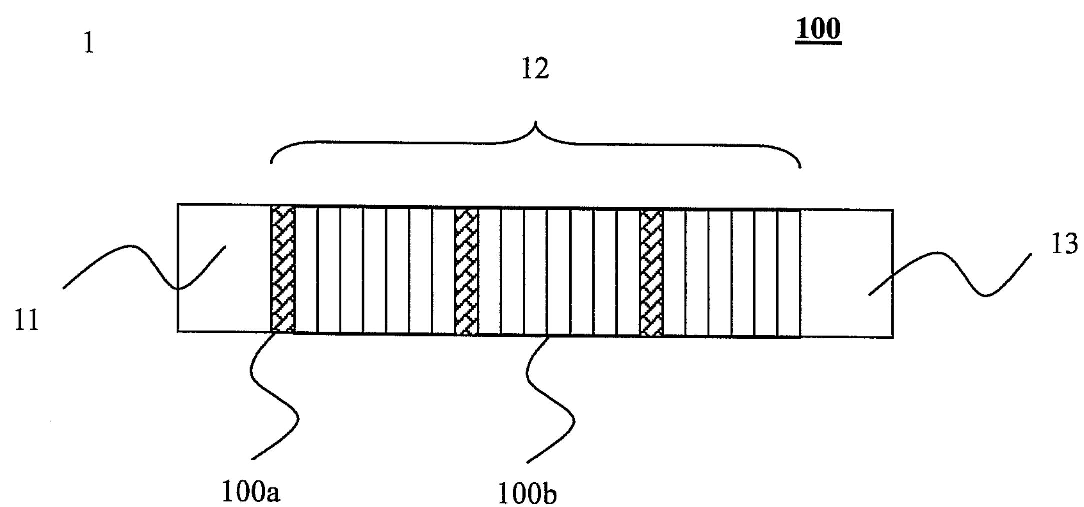
FIG. 1 is a diagram of a light-emitting structure in accordance with the first embodiment of the present application.

FIG. 1 shows a diagram of a light-emitting structure 12 in the epitaxial structure 100 of the light-emitting device 1 in accordance with the first embodiment of the present application, wherein the light-emitting structure 12 is between a first conductivity type semiconductor layer 11 and a second conductivity type semiconductor layer 13. In the present embodiment, the structure of the light-emitting device 1 comprises a growth substrate (not shown in the figure), a first conductivity type semiconductor layer 11, a light-emitting structure 12, and a second conductivity type semiconductor layer 13 on the growth substrate formed in sequence. The material of the growth substrate can be gallium arsenic, sapphire, silicon carbide, gallium nitride, aluminum nitride, silicon, and germanium. The light-emitting structure 12 is formed by a first active layer **100*a* and a second active layer 100*b* stacked alternately, wherein the first active layer 100*a* is a quantum well structure and can emit a first light-emitting wavelength $\lambda_1$, the second active layer 100*b*** is a quantum well structure and can emit a second light-emitting wavelength $\lambda_2$. The $\lambda_1$ is larger than the $\lambda_2$. The light-emitting structure is formed by an III-V group semiconductor material, wherein the material of the III-V group semiconductor can be AlGaInP series compound, AlGaInN series compound, or a combination of the two compounds.

Concluding from many experiment data, the light-emitting structure 12 is formed by the first active layer 100*a* and the second active layer 100*b* stacked alternately, and when the total layers of the first active layer 100*a* and the second active layer 100*b* is 23n (n is an integer number greater than 0) with d layers of the second active layer 100*b* interlaced between every two of the first active layers 100*a* ($4n \le d \le 10n$), the absolute value of the difference of the measured temperature coefficients of the light-emitting devices 1 having the light-emitting structures 12 formed by different manufacturing processes is smaller than 0.12%/K. One reason is when there are too many layers of the first active layer 100*a* which can emit the longer first wavelength $\lambda_1$, the electrons do not necessarily fill up the whole energy level positions so the distribution of the electrons is not uniform; when there are too few layer, the energy level positions for electron occupation is not enough.

In the present embodiment, the first active layer 100*a* can emit the light with a wavelength of 610 nm, the second active layer 100*b* can emit the light with a wavelength of 600 nm, and the total layers of the first active layer 100*a* and the second active layer 100*b* is 23 (n=1) with d layers of the second active layer 100*b* interlaced between every two of the first active layers 100*a* ($4 \le d \le 10$). For example, the light-emitting structure 12 is formed by one layer of the first active layer 100*a*/seven layers of the second active layer 100*b*/one layer of the first active layer 100*a*/seven layers of the second active layer 100*b*/one layer of the first active layer 100*a*/six layers of the second active layer 100*b* stacked in sequence. The measured flux is 155.7 lm at 25° C., and the measured flux is 81.6 lm at 100° C. for the light-emitting device 1 comprising the light-emitting structure 12 formed by a first manufacturing process. The first temperature coefficient ($TC_1$) calculated by the equation (1) is −0.65%/K. The measured flux is 1445 lm at 25° C., and the measured flux is 636 lm at 100° C. for the light-emitting device 1 formed by a second manufacturing process. The second temperature coefficient ($TC_2$) calculated by the equation (1) is −0.75%/K. The absolute value of the difference between the first temperature coefficient ($TC_1$) and the second temperature coefficient ($TC_2$) is 0.1%/K. The first manufacturing process and the second manufacturing process comprise different parameters, manufacture conditions of the exposure, developing, etching, evaporation, polish, and cutting, and so on. It is found that in the present embodiment the temperature coefficient of light-emitting structure formed by two active layers with different light-emitting wavelengths stacked alternately is not affected by the manufacturing processes, which means the electrons can distribute uniformly in the light-emitting structure of the light-emitting device.

Figure 2:
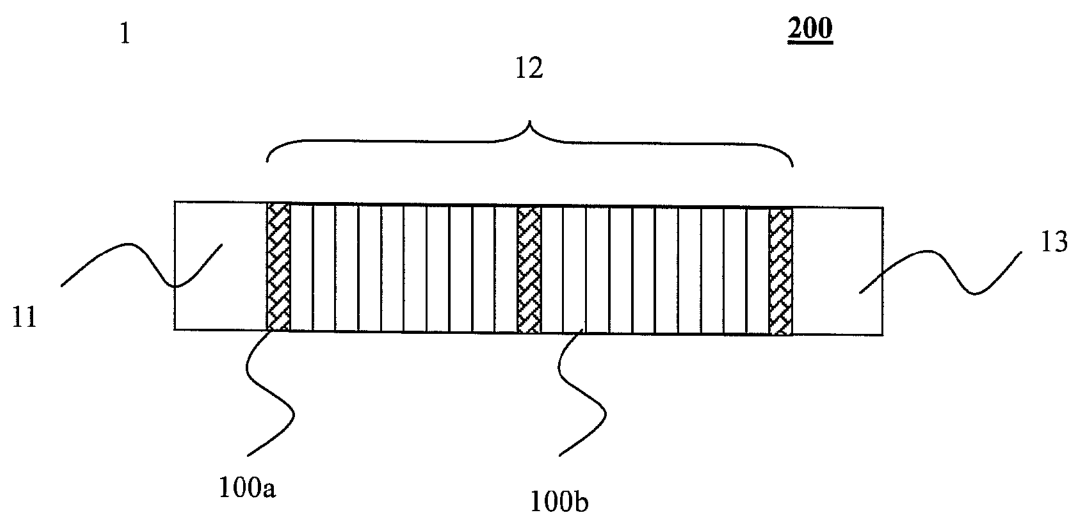
FIG. 2 is a diagram of a light-emitting structure in accordance with the second embodiment of the present application.

FIG. 2 shows a diagram of a light-emitting structure 12 in the epitaxial structure 200 of the light-emitting device 1 in accordance with the second embodiment of the present application, wherein the light-emitting structure 12 is between a first conductivity type semiconductor layer 11 and a second conductivity type semiconductor layer 13. In the present embodiment, the light-emitting structure 12 is formed by a first active layer 100*a* and a second active layer 100*b* stacked alternately, wherein the first active layer 100*a* is a quantum well structure and can emit a first light-emitting wavelength $\lambda_1$, the second active layer 100*b* is a quantum well structure and can emit a second light-emitting wavelength $\lambda_2$. The $\lambda_1$ is larger than the $\lambda_2$. The light-emitting structure is formed by an III-V group semiconductor material, wherein the material of the III-V group semiconductor can be AlGaInP series compound, AlGaInN series compound, or a combination of the two compounds.

In the present embodiment, the first active layer 100*a* can emit the light with a wavelength of 610 nm, the second active layer 100*b* can emit the light with a wavelength of 600 nm, and the total layers of the first active layer 100*a* and the second active layer 100*b* is 23 (n=1) with d layers of the second active layer 100*b* interlaced between every two of the first active layers 100*a* ($4 \le d \le 10$). For example, the light-emitting structure 12 is formed by one layer of the first active layer 100*a*/ten layers of the second active layer 100*b*/one layer of the first active layer 100*a*/ten layers of the second active layer 100*b*/one layer of the first active layer 100*a* stacked in sequence. The measured flux is 139.1 lm at 25° C., and the measured flux is 72.4 lm at 100° C. for the light-emitting device 1 comprising the light-emitting structure 12 formed by a first manufacturing process. The first temperature coefficient ($TC_1$) calculated by the equation (1) is −0.66%/K. The measured flux is 1477.4 lm at 25° C., and the measured flux is 624.8 lm at 100° C. for the light-emitting device 1 formed by a second manufacturing process. The second temperature coefficient ($TC_2$) calculated by the equation (1) is −0.77%/K. The absolute value of the difference between the first temperature coefficient ($TC_1$) and the second temperature coefficient ($TC_2$) is 0.11%/K. The first manufacturing process and the second manufacturing process comprise different parameters, manufacture conditions of the exposure, developing, etching, evaporation, polish, and cutting, and so on. It is found in the present embodiment that the temperature coefficient of light-emitting structure formed by two different wavelength active layers stacked alternately is not affected by the manufacturing process even the stacked layers of the two active layers are different, which means the electrons can distribute uniformly in the light-emitting structure of the light-emitting device.

Figure 3:
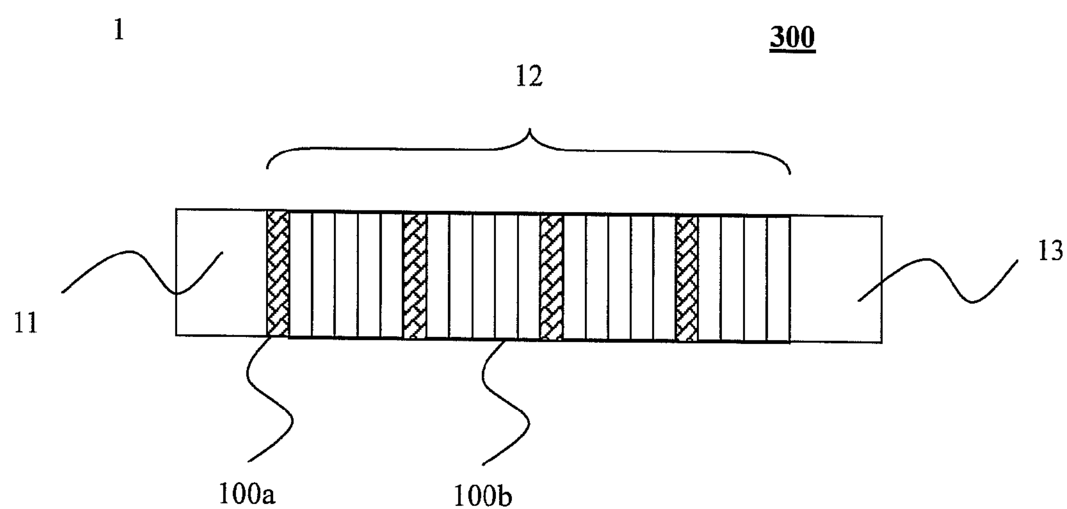
FIG. 3 is a diagram of a light-emitting structure in accordance with the third embodiment of the present application.

FIG. 3 shows a diagram of a light-emitting structure 12 in the epitaxial structure 300 of the light-emitting device 1 in accordance with the third embodiment of the present application, wherein the light-emitting structure 12 is between a first conductivity type semiconductor layer 11 and a second conductivity type semiconductor layer 13. In the present embodiment, the light-emitting structure 12 is formed by a first active layer 100*a* and a second active layer 100*b* stacked alternately, wherein the first active layer 100*a* is a quantum well structure and can emit a first light-emitting wavelength $\lambda_1$, the second active layer 100*b* is a quantum well structure and can emit a second light-emitting wavelength $\lambda_2$, and the $\lambda_1$ is larger than the $\lambda_2$. The light-emitting structure is formed by an III-V group semiconductor material, wherein the material of the III-V group semiconductor can be AlGaInP series compound, AlGaInN series compound, or a combination of the two compounds.

In the present embodiment, the first active layer 100*a* can emit the light with a wavelength of 610 nm, the second active layer 100*b* can emit the light with a wavelength of 600 nm, and the total layers of the first active layer 100*a* and the second active layer 100*b* is 23 (n=1) with d layers of the second active layer 100*b* interlaced between every two of the first active layers 100*a* ($4 \le d \le 10$). For example, the light-emitting structure 12 is formed by one layer of the first active layer 100*a*/five layers of the second active layer 100*b*/one layer of the first active layer 100*a*/five layers of the second active layer 100*b*/one layer of the first active layer 100*a*/five layers of the second active layer 100*b*/one layer of the first active layer 100*a*/four layers of the second active layer 100*b* stacked in sequence. The measured flux is 134.1 lm at 25° C., and the measured flux is 67.3 lm at 100° C. for the light-emitting device 1 comprising the light-emitting structure 12 formed by a first manufacturing process. The first temperature coefficient ($TC_1$) calculated by the equation (1) is −0.68%/K. The measured flux is 1343.5 lm at 25° C., and the measured flux is 646.4 lm at 100° C. for the light-emitting device 1 formed by a second manufacturing process. The second temperature coefficient ($TC_2$) calculated by the equation (1) is −0.69%/K. The absolute value of the difference between the first temperature coefficient ($TC_1$) and the second temperature coefficient ($TC_2$) is 0.01%/K. The first manufacturing process and the second manufacturing process comprise different parameters, manufacture conditions of the exposure, developing, etching, evaporation, polish, and cutting, and so on. It is found in the present embodiment that the temperature coefficient of light-emitting structure formed by two active layers with emitting different light-emitting wavelength stacked alternately is not affected by the manufacturing process even the stacked layers of the two active layers are different, which means the electrons can distribute uniformly in the light-emitting structure of the light-emitting device.

Figure 4:
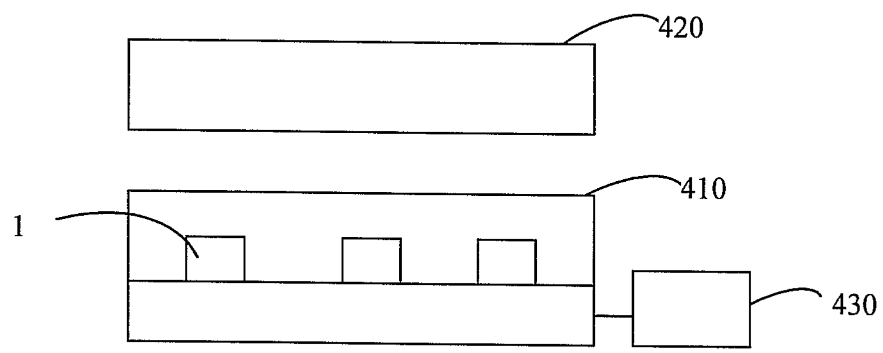
FIG. 4 is a diagram showing a backlight module device in accordance with the fourth embodiment of the present application.

FIG. 4 shows a backlight module device 400 in accordance with the fourth embodiment of the present application. The backlight module device 400 comprises a light source device 410 having the light-emitting device 1 in one of the above mentioned embodiments, an optics device 420 deposited on the light extraction pathway of the light source device 410, and a power supply system 430 which provides a predetermined power to the light source device 410.

Figure 5:
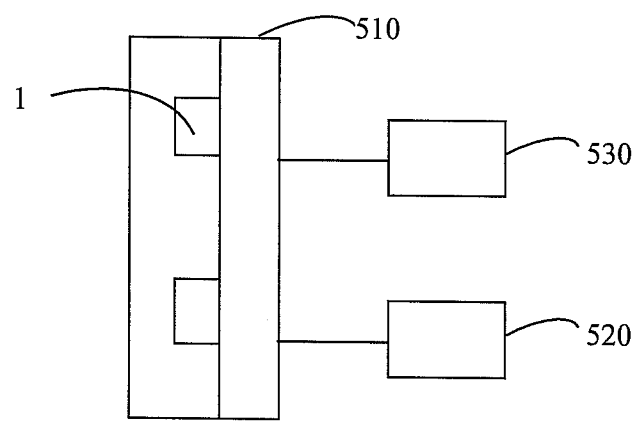
FIG. 5 is a diagram showing an illumination device in accordance with the fifth embodiment of the present application.

FIG. 5 shows an illumination device 500 in accordance with the fifth embodiment of the present application. The illumination device 500 can be automobile lamps, street lights, flashlights, indicator lights and so forth. The illumination device 500 comprises a light source device 510 having the light-emitting device 1 in one of the above mentioned embodiments, a power supply system 520 which provides a predetermined power to the light source device 410, and a control element 530 which controls the current driven into the light source device 510.

As is understood by a person skilled in the art, the foregoing preferred embodiments of the present application are illustrated of the present application rather than limiting of the present application. It is intended to cover various modifications and similar arrangements included within the spirit and scope of the appended claims, the scope of which should be accorded the broadest interpretation so as to encompass all such modifications and similar structure.

What is claimed is:

1. A light-emitting device, comprising:

a substrate;

a first conductivity type semiconductor layer on the substrate;

a light-emitting structure on the first conductivity type semiconductor layer, comprising:

a plurality of first active layers, each of first active layers having a quantum well structure and emitting a light with a first light-emitting wavelength; and a plurality of second active layers, each of second active layers having a quantum well structure and emitting a light with a second light-emitting wavelength; and a second conductivity type semiconductor layer on the light-emitting structure, wherein the first active layers and the second active layers are stacked alternately, and wherein the first light-emitting wavelength is larger than the second light-emitting wavelength wherein the first active layer is a single layer, and the second active layer comprises multiple layers, and wherein the first light-emitting wavelength is the same for each of the first active layers and the second light-emitting wavelength is the same for each of the second active layers.

2. The light-emitting device according to claim 1, wherein a number of the total layers of the first active layers and the second active layers is 23n, wherein n is an integer number greater than 0.

3. The light-emitting device according to claim 2, wherein d layers of the second active layers are disposed between every two layers of the first active layers, wherein $4n \le d \le 10n$.

4. The light-emitting device according to claim 1, wherein the substrate comprises gallium arsenic.

5. The light-emitting device according to claim 1, wherein a material of the light-emitting structure can be AlGaInP series compound, AlGaInN series compound, or a combination of the two compounds.

6. A backlight module device, comprising:

a light source device having a light-emitting device made according to claim 1;

an optics device deposited on a light extraction pathway of the light source device; and a power supply system to provide a predetermined power to the light source device.

7. An illumination device, comprising:

a light source device having a light-emitting device made according to claim 1;

a power supply system to provide a predetermined power of the light source device; and a control element to control the current driven into the light source device.

8. The light-emitting device according to claim 1, wherein the substrate comprises sapphire.

9. The light-emitting device according to claim 1, wherein the substrate comprises silicon carbide.

10. The light-emitting device according to claim 1, wherein the substrate comprises gallium nitride.

11. The light-emitting device according to claim 1, wherein the substrate comprises aluminum nitride.

12. The light-emitting device according to claim 1, wherein the substrate comprises silicon.

* * * * *